United States Patent
Qiu et al.

(10) Patent No.: US 8,273,259 B1
(45) Date of Patent: Sep. 25, 2012

(54) ASHING METHOD

(75) Inventors: Huatan Qiu, Sunnyvale, CA (US); David Wingto Cheung, Foster City, CA (US)

(73) Assignee: Novellus Systems, Inc., San Jose, CA (US)

( * ) Notice: Subject to any disclaimer, the term of this patent is extended or adjusted under 35 U.S.C. 154(b) by 884 days.

(21) Appl. No.: 12/321,227

(22) Filed: Jan. 17, 2009

(51) Int. Cl.
   *G01L 21/30* (2006.01)
(52) U.S. Cl. ............. 216/59; 216/61; 216/67; 438/725; 438/730
(58) Field of Classification Search .................. 216/59, 216/61, 67; 438/725, 730
   See application file for complete search history.

(56) References Cited

U.S. PATENT DOCUMENTS

| | | | |
|---|---|---|---|
| 5,677,113 A | 10/1997 | Suzuki et al. | |
| 6,439,155 B1 | 8/2002 | Kamarchi et al. | |
| 6,599,438 B2 | 7/2003 | Levenson et al. | |
| 2004/0214448 A1 | 10/2004 | Chan et al. | |
| 2006/0292491 A1* | 12/2006 | Chung et al. | 430/270.1 |
| 2007/0193602 A1* | 8/2007 | Savas et al. | 134/1.1 |
| 2008/0153306 A1* | 6/2008 | Cho et al. | 438/712 |
| 2008/0182422 A1 | 7/2008 | Edelberg et al. | |
| 2008/0210273 A1* | 9/2008 | Joe | 134/133 |
| 2010/0043821 A1* | 2/2010 | Li et al. | 134/1.2 |

* cited by examiner

*Primary Examiner* — Binh X Tran

(57) ABSTRACT

Ashing of organic material is conducted initially at a low temperature and then at a high temperature. A low flow rate of ashing gas maximizes ashing rate at the low temperature, and a high flow rate of ashing gas maximizes ashing rate at a high temperature. Preferably, a crossover temperature of a particular organic material in a given ashing system is determined, the crossover temperature characterized in that below the crossover temperature, a decrease in ashing gas flow rate results in an increase of ashing rate, and above the crossover temperature, an increase in ashing gas flow rate results in an increase of ashing rate.

36 Claims, 8 Drawing Sheets

ASHING METHOD

FIELD OF THE INVENTION

The present invention pertains generally to the field of integrated circuit fabrication, particularly to methods for removal of organic material by ashing.

BACKGROUND OF THE INVENTION

Integrated circuits are formed on wafers by well-known processes and materials. These processes typically include the deposition of thin film layers by sputtering, metal-organic decomposition, chemical vapor deposition, plasma vapor deposition, ion-implantation and other techniques. These layers are processed by a variety of well-known etching technologies and subsequent deposition steps to provide a completed integrated circuit.

Removal of organic material from a substrate surface is an important part of the process of fabricating semiconductor and other electronic devices. As the demand for greater throughput rates and the density of electronic devices increase, methods for removing organic material confront two often-conflicting requirements: a need for higher rates of residual-free removal of the organic material; and avoidance of damage caused to the substrate underlying the organic material being removed.

In plasma processing techniques, such as plasma etching, reactive ion etching (RIE) and ion implantation, photoresist is applied to a substrate to protect selected regions of the substrate from being exposed to ions and free radicals. Organic polymer compositions have been formulated for such resist applications. After the plasma processing, photoresist is removed, or stripped, from the underlying substrate.

During the fabrication of transistors, resistors, diodes and other microelectronic devices, a common practice is the implantation of a dopant into a substrate. Ion implantation techniques are used to dope regions of the substrate with impurities to change the electrical properties of the substrate. Ion implantation can be used as a source of doping atoms, or to introduce regions of different composition in a substrate. During ion implantation, ions are accelerated at a sufficiently high voltage to penetrate the substrate surface to a desired depth. Regions of the substrate at which implantation is not desired are protected with photoresist. The photoresist, however, is modified during implantation, and is rendered more difficult to remove after implantation than a normal (non-implanted) photoresist. In a transistor, for example, the implant is directed to a portion of an active area between isolation regions. The dopant is typically boron, phosphorus or arsenic ions that are implanted at high energy to form features such as lightly doped source/drain (S/D) regions in the substrate. Other parts of a device including a gate electrode and sidewall spaces adjacent to the gate may also be doped by an ion implant process.

The ion implant is performed through a mask that is usually a photoresist layer that is patterned to selectively expose regions of the substrate that are to be doped. The photoresist must be thick enough to prevent ions from reaching protected substrate regions. Unfortunately, a photoresist mask is not inert toward the high energy ions. Particularly, implanted ions damage regions of the photoresist, thereby breaking near-surface C—H bonds and forming carbon-carbon single and double bonds. As a result, the top portion of the photoresist layer is transformed into a carbonized "crust". The tough, carbon-rich or carbonized crust of cross-linked, implanted photoresist encapsulates the distinct underlying bulk photoresist. The thickness of the carbon-rich layer is a function of the implant species, voltage, dose and current. The carbon-rich crust typically has a thickness in a range of about from 200 Å to about 2000 Å. A carbon-rich crust can also be formed in organic photoresist during plasma processing techniques other than the ion implantation techniques, in which ion bombardment of the photoresist also occurs. A carbonized crust is difficult to remove because of its low solubility in wet strippers. A plasma etch can successfully strip the crust, but often the etchant attacks the substrate or other portions of the device to cause a loss in performance.

Two categories of techniques are used to remove photoresist and other organic material from a substrate: wet stripping and dry stripping. In wet stripping techniques, one or more liquid etching solutions are used to etch the organic material from the substrate. As mentioned above, wet stripping is usually unsuitable for a carbonized crust.

Dry stripping techniques can be further classified into plasma etching and downstream ashing. In plasma etching, the substrate is placed directly into the plasma environment and excited species are generated by the in-situ plasma. Generally, chemical reactions of both charged species (e.g., $O^+$) and non-charged free radicals with the organic photoresist material contribute to etching. To enhance chemical etching, a bias is usually placed on the substrate to attract charged ions to the substrate surface. In addition, physical etching by physical sputtering of the substrate by charged ionic species contributes to overall stripping of the photoresist. An advantage of plasma etching is that the same system can be used both for initial patterning of the photoresist and for stripping of the photoresist after ion implantation. A disadvantage of plasma etching is that the substrate is inevitably subjected to plasma damage. For example, energetic $O_2^+$ can cause undesired sputtering of unprotected underlying inorganic substrate and may have sufficient energy to penetrate an inorganic substrate and oxidize it. As a result, when used, plasma etching is usually performed at very low pressure (e.g., 10-200 mTorr), low gas flow rate, and low temperature (e.g., 25° C.).

In downstream ashing, plasma is generated in a remote plasma generator, the plasma is used to generate excited species in an ashing gas, and then ashing gas containing excited species flows into an ashing chamber downstream from the plasma generator. Generally, charged species are filtered out of the ashing gas stream so that only non-charged free radicals flow with the ashing gas into the ashing chamber. Thermochemical reaction occurs between the neutral radicals (e.g., free atomic oxygen radicals, O) and the organic photoresist. Due to the absence of charged radicals and ions, no bias is applied to the substrate. Generally, compared to plasma etching, downstream ashing is performed at Torr pressure range, higher flow rate ranges, and at as high temperature as possible without causing damage to the substrate. Downstream ashing is generally easier to control than plasma etching and is less prone to damage the substrate than plasma etching.

As mentioned above, ion implantation often results in formation of a carbonized crust at the surface of a photoresist film. The presence of a crust covering the bulk organic photoresist material requires that ashing be performed initially at a relatively low temperature; for example, in a range of 120° C. to 160° C.

During ashing, solvent in the bulk organic material tends to volatize. Because a crust at the surface inhibits the escape of volatilized solvent, solvent vapors accumulate within the crust and finally reach sufficient pressure to pop through the crust. This phenomenon is commonly known as "popping" and it causes numerous problems and complications, for example, residue removal complications during subsequent cleaning steps. To avoid popping, ashing is performed at low temperature (e.g., 120° C.-160° C.) until the crust is completely removed. Once the crust is removed, ashing can be performed at a higher temperature.

It is generally believed in the prior art that for any given substrate temperature, the higher the flow rate of excited (or activated) species to a downstream ashing chamber, the higher the ashing rate. Since ashing involves thermochemical reaction, low-temperature ashing (e.g., at 130° C.) to remove the crust proceeds at a slower reaction rate than ashing at a higher temperature (e.g., 300° C.). Low-temperature ashing results, therefore, in longer overall ashing time and in reduced system throughput compared to ashing at higher temperature.

Thus, there is a need for an improved ashing method that avoids undesired popping during crust removal while also minimizing total ashing time (maximizing ashing reaction rate) to maximize substrate processing throughput.

SUMMARY OF THE INVENTION

The present invention helps to solve some of the problems and satisfy some of the needs outlined above by providing methods for minimizing total ashing time of an organic material in an ashing system when ashing is performed initially at one temperature and then at a different temperature. The invention is described herein mainly with reference to the ashing of HDIS photoresist having a carbonized crust. It is understood, however, that methods and systems in accordance with the invention are also useful for any process involving ashing of organic material.

Some embodiments in accordance with the invention include explicit reference to the crossover temperature of a particular organic material in a particular ashing system. The crossover temperature is characterized in that below the crossover temperature, a decrease in ashing gas flow rate results in an increased measured ashing rate, and above the crossover temperature, an increase in ashing gas flow rate results in an increased measured ashing rate.

A basic embodiment of a method in accordance with the invention of determining a crossover temperature of a type of organic material in an ashing system comprises steps of: (a) heating a test sample of a type of organic material at a test temperature in an ashing chamber; (b) flowing ashing gas to a remote plasma generator; (c) generating activated ashing species in the ashing gas using the remote plasma generator; (d) flowing activated ashing gas containing activated ashing species into the ashing chamber at a test flow rate; (e) performing ashing of the test sample in the ashing chamber at the test temperature and at the test flow rate to ash at least a portion of the test sample using the activated ashing species; (f) measuring an ashing time used to ash the portion of the test sample; (g) measuring the portion; and (h) calculating a measured ashing rate corresponding to the test temperature and the test flow rate based on the ashing time used to ash the portion; (i) repeating steps (a) through (h) using at least one test sample of the type of organic material at a plurality of different combinations of test temperatures and test flow rates to calculate a plurality of measured ashing rates; and (j) then determining a crossover temperature of the type of organic material in the ashing system by comparing the measured ashing rates, wherein the crossover temperature is characterized in that below the crossover temperature, a decrease in test flow rate results in an increased measured ashing rate, and above the crossover temperature, an increase in test flow rate results in an increased measured ashing rate. Some embodiments further comprise a step of determining a preferred low flow rate of ashing gas corresponding to a preferred low-temperature ashing rate below the crossover temperature. Some embodiments further comprise a step of determining a preferred high flow rate of ashing gas corresponding to a preferred high-temperature ashing rate above the crossover temperature.

A basic embodiment of a method in accordance with the invention of minimizing total ashing time of organic material in an ashing system comprises steps of: (a) heating in a low-temperature ashing chamber a substrate containing an initial layer of organic material at a low temperature below a crossover temperature of the organic material in an ashing system; (b) flowing ashing gas to a remote plasma generator; (c) generating activated ashing species in the ashing gas using the remote plasma generator; (d) flowing activated ashing gas containing activated ashing species into the low-temperature ashing chamber at a low flow rate; (e) performing ashing of the layer of organic material at the low temperature and at the low flow rate to ash an initial portion of the layer of organic material using the activated ashing species in the low-temperature ashing chamber; then (f) heating the substrate in a high-temperature ashing chamber at a high temperature above the crossover temperature of the organic material in the ashing system; (g) flowing an ashing gas to a remote plasma generator; (h) generating activated ashing species in the ashing gas using the remote plasma generator; (i) flowing activated ashing gas containing activated ashing species into the high-temperature ashing chamber at a high flow rate; and (j) performing ashing of the organic material using the activated ashing species in the high-temperature ashing chamber at the high temperature and at the high flow rate to ash an additional portion of the layer of organic material. The method is particularly useful when the layer of organic material comprises photoresist having a carbonized crust. Thus, in some embodiments, step (e) includes ashing at least a portion of a carbonized crust. In some embodiments, the low flow rate of ashing gas corresponds to a preferred low-temperature ashing rate below the crossover temperature. In some embodiments, the high flow rate of ashing gas corresponds to a preferred high-temperature ashing rate above the crossover temperature. In some embodiments, the low flow rate of ashing gas corresponds to a preferred low-temperature ashing rate below the crossover temperature. In some embodiments, the high flow rate of ashing gas corresponds to a preferred high-temperature ashing rate above the crossover temperature. In some embodiments, the activated ashing species in steps (e) and (j) comprise oxygen free radicals, O. Some embodiments further comprise determining the crossover temperature of the organic material in the ashing system, as summarized above.

Knowing that an ashing crossover temperature exists for any organic material, one skilled in the art might perform an ashing process in accordance with the invention without explicit reference to the crossover temperature. Accordingly, another basic embodiment of a method in accordance with the invention of minimizing total ashing time of organic material in an ashing system comprises steps of: (a) heating a substrate containing organic material at a low temperature in a low-temperature ashing chamber; (b) flowing ashing gas to a remote plasma generator; (c) generating activated ashing species in the ashing gas using the remote plasma generator; (d) flowing activated ashing gas containing activated ashing species into the low-temperature ashing chamber at a low flow rate; (e) performing ashing of the organic material at the low temperature and at the low flow rate to ash an initial portion of the organic material using the activated ashing species in the low-temperature ashing chamber; then (f) heating the substrate at a high temperature in a high-temperature ashing chamber; (g) flowing an ashing gas to a remote plasma generator; (h) generating activated ashing species in the ashing gas using the remote plasma generator; (i) flowing activated ashing gas containing activated ashing species into the high-temperature ashing chamber at a high flow rate; and (j) performing ashing of the organic material using the activated ashing species in the high-temperature ashing chamber at the high temperature and at the high flow rate to ash an additional portion of the organic material. In some embodiments, the low temperature is selected from a low-temperature range; and the low flow rate is selected from a low flow-rate range; wherein a lower flow rate within the low flow-rate range results in a faster ashing rate of the organic material when ashing is performed within the low-temperature range. Generally, the low-temperature range does not exceed a crossover temperature of the organic material in the ashing system. In some embodiments, the high temperature is selected from a high-temperature range; and the high flow rate is selected from a high flow-rate range; wherein a higher flow rate within the high flow-rate range results in a faster ashing rate of the organic material when ashing is performed within the high-temperature range. Generally, the high-temperature range is not less than a crossover temperature of the organic material in the ashing system. In some embodiments, flowing ashing gas in step (b) comprises flowing substantially oxygen-containing gas; and generating activated ashing species in step (c) comprises generating substantially activated oxygen species. In some embodiments, the oxygen-containing gas comprises substantially oxygen ($O_2$) gas. In some embodiments, the activated ashing species comprise substantially no halogen species. In some embodiments, the ashing gas in step (b) comprises a halogen gas, and the activated ashing species in step (c) comprise halogen species. In some embodiments, the activated ashing species in steps (e) and (j) comprise oxygen free radicals, O.

Embodiments in accordance with the invention are also useful in applications in which ashing of an organic material is performed initially at a higher temperature and thereafter at a lower temperature. Accordingly, another basic embodiment of minimizing total ashing time of organic material in an ashing system comprises: (a) heating a substrate containing organic material at a high temperature in a high-temperature ashing chamber; (b) flowing ashing gas to a remote plasma generator; (c) generating activated ashing species in the ashing gas using the remote plasma generator; (d) flowing activated ashing gas containing activated ashing species into the high-temperature ashing chamber at a high flow rate; (e) performing ashing of the organic material at the high temperature and at the high flow rate to ash an initial portion of the organic material using the activated ashing species in the high-temperature ashing chamber; then (f) heating the substrate at a low temperature in a low-temperature ashing chamber; (g) flowing an ashing gas to a remote plasma generator; (h) generating activated ashing species in the ashing gas using the remote plasma generator; (i) flowing activated ashing gas containing activated ashing species into the low-temperature ashing chamber at a low flow rate; and (j) performing ashing of the organic material using the activated ashing species in the low-temperature ashing chamber at the low temperature and at the low flow rate to ash an additional portion of the organic material.

Other features, characteristics and advantages of embodiments in accordance with the invention will become apparent in the detailed description below.

DETAILED DESCRIPTION OF THE INVENTION

Figure 1:
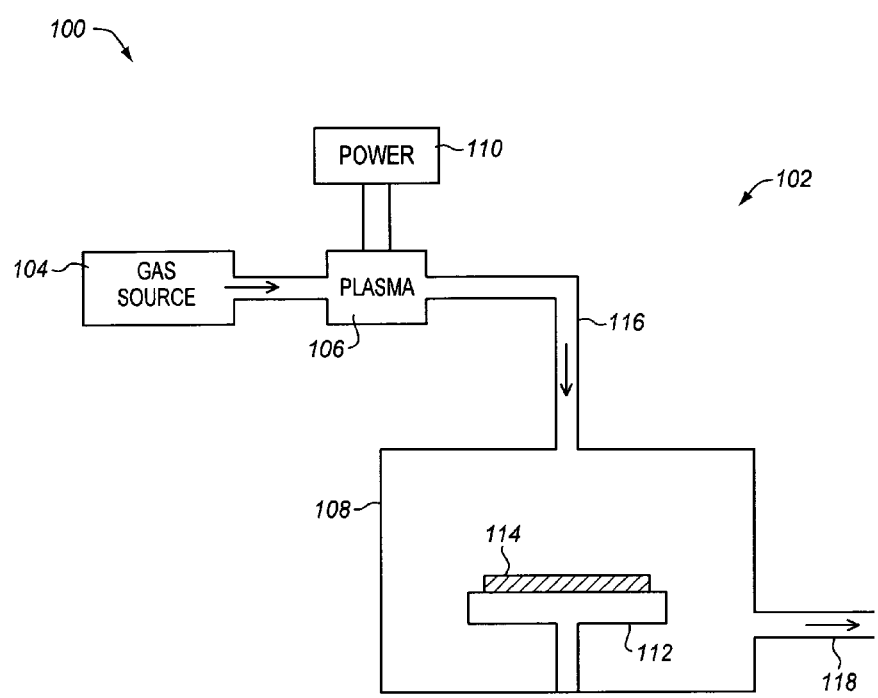
FIG. 1 depicts schematically a cross-sectional view of a generalized downstream ashing system (also known as a chemical downstream etch reactor) suitable for ashing organic material in accordance with the invention.
Figure 2:
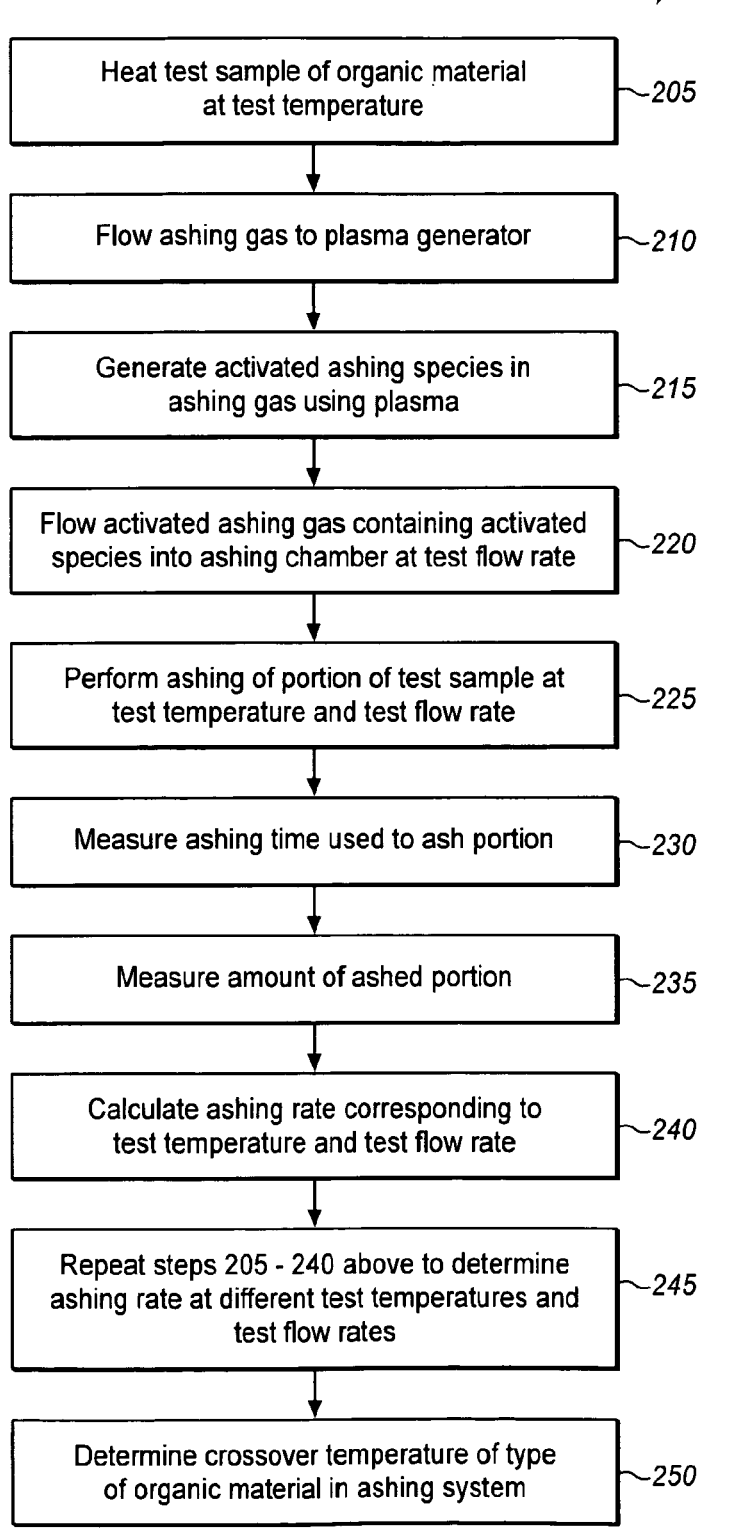
FIG. 2 contains a process flow sheet of a generalized, representative method in accordance with the invention for determining a crossover temperature of a particular type of organic material in an ashing system.
Figure 6:
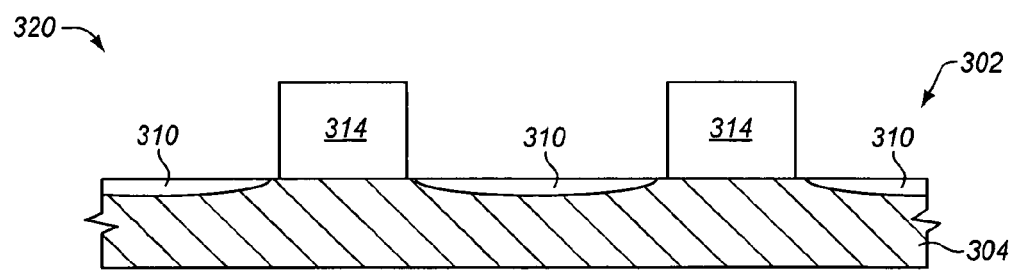
FIG. 6 depicts cross-sectional view of the substrate depicted in FIG. 5 after substantial removal of carbonized crust by ashing at low temperature in accordance with the invention.
Figure 7:
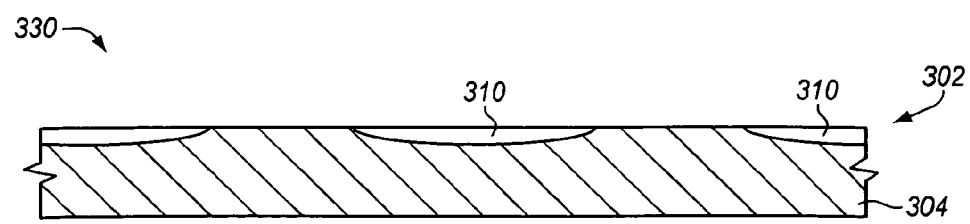
FIG. 7 depicts cross-sectional view of the substrate depicted in FIG. 6 after removal of bulk photoresist in accordance with the invention.
Figure 8:
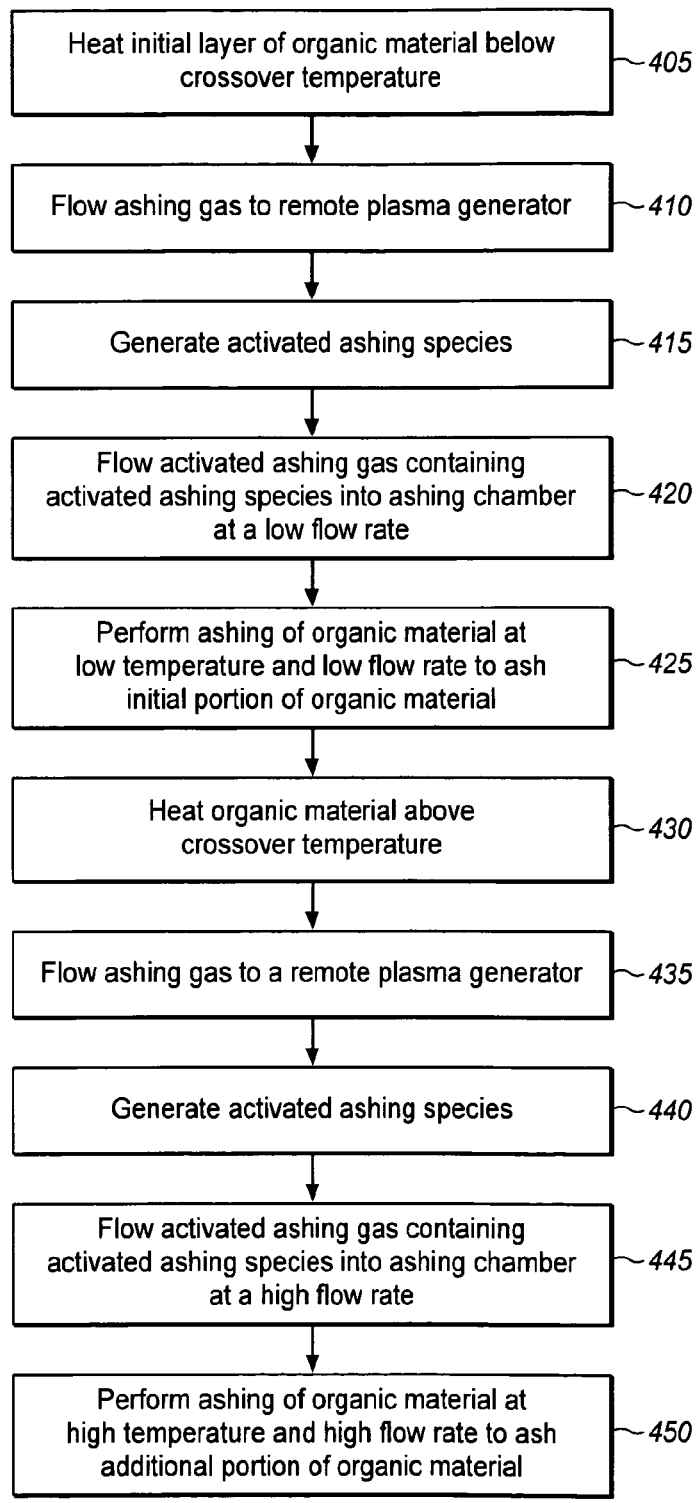
FIG. 8 contains a process flow sheet of a generalized method in accordance with the invention for minimizing total ashing time of organic material in an ashing system.
Figure 9:
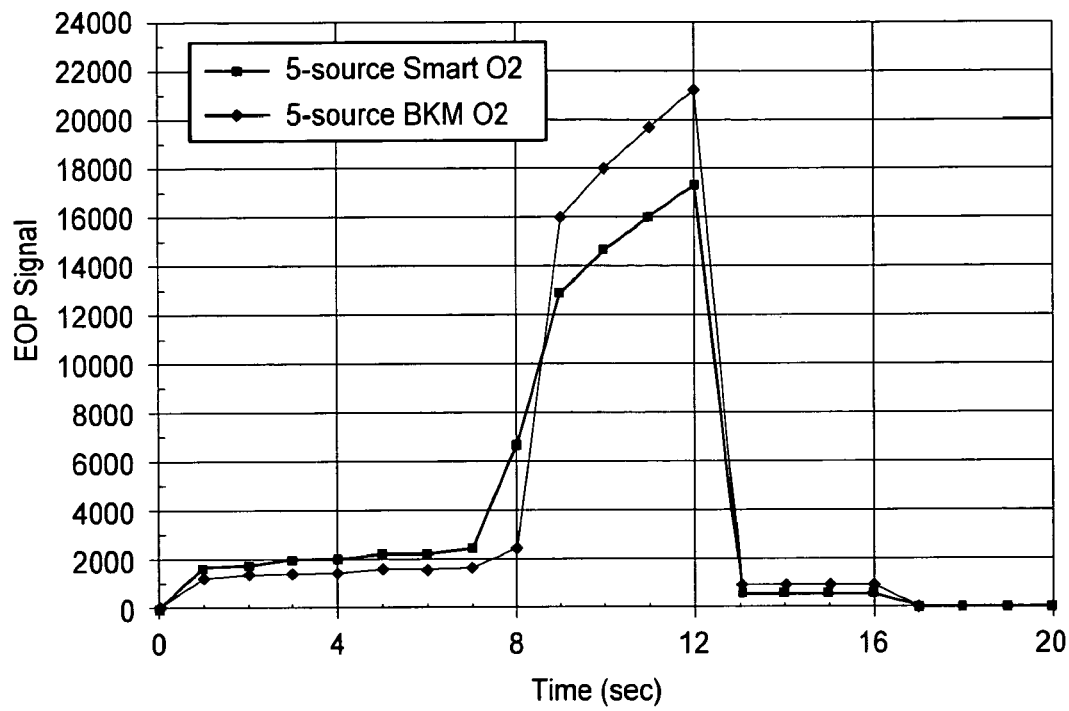
FIG. 9 contains a graph in which EOP Signal indicating a momentary ashing rate is plotted as a function of time (seconds)
Figure 10:
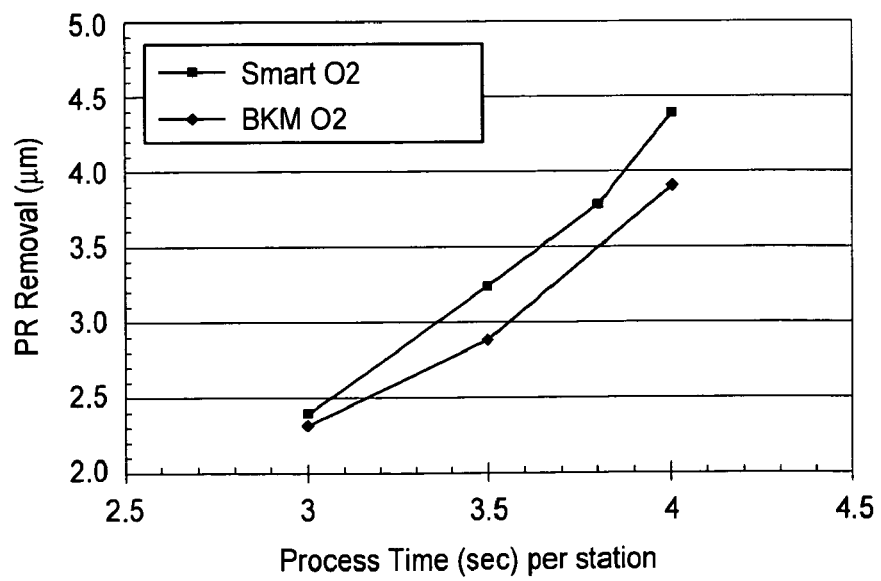
FIG. 10 contains a graph in which cumulative photoresist removal in units of micrometers (μm) is plotted as a function of ashing time (seconds) per station.
Figure 11:
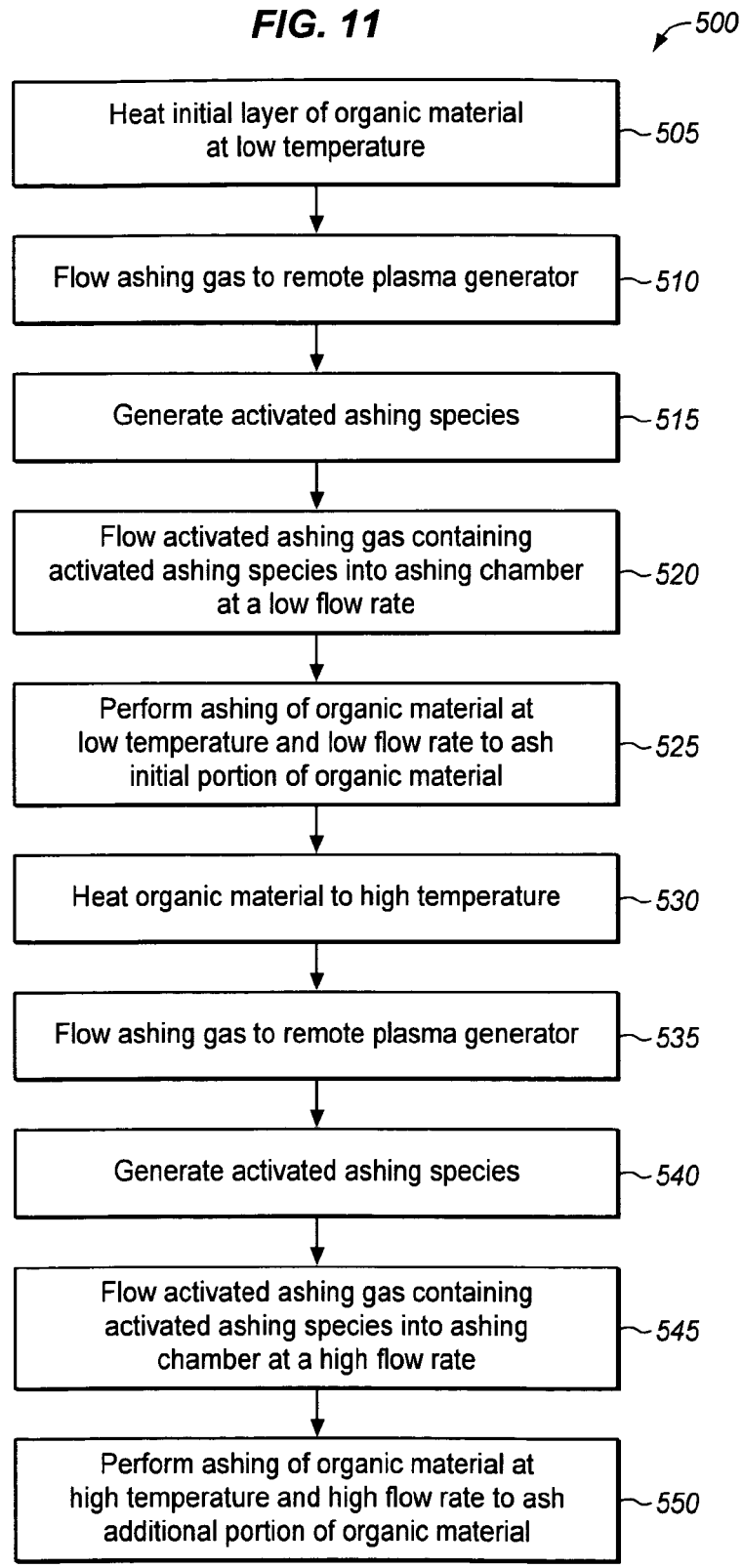
FIG. 11 contains a process flow sheet of a generalized method in accordance with the invention for minimizing total ashing time of organic material in an ashing system without explicit reference to a crossover temperature.

The invention is described herein with reference to FIGS. 1-11. It should be understood that the structures and systems depicted in schematic form in FIGS. 1, 5-7 are used to explain the invention and are not a precise depiction of actual structures and systems in accordance with the invention. Similarly, methods in accordance with the invention described with reference to the process flow sheets contained in FIGS. 2, 8 and 11 are exemplary. Similarly, the methods described in Examples 1-3 below are exemplary. Some methods in accordance with the invention include additional steps and steps performed in somewhat different sequences from those described herein. Although embodiments of the invention are described herein mainly with reference to ashing of organic photoresist having a carbonized crust, it is understood that embodiments in accordance with the invention are useful in other applications in which ashing temperature is varied during removal of organic material from a substrate. Furthermore, the embodiments described herein are not intended to limit the scope of the invention, which is defined in the claims below.

FIG. 1 depicts schematically a cross-sectional view 100 of a generalized downstream ashing system (also known as a chemical downstream etch reactor) 102 suitable for ashing organic material in accordance with the invention. Ashing system 102 includes a gas source 104, a remote plasma generator 106 and a downstream ashing chamber 108. Remote plasma generator 106 includes a power source 110. Ashing system 102 further includes a substrate holder 112 that is operable to hold a substrate 114 during ashing operations. During ashing, ashing system 102 is operable to flow a stream of ashing gas from gas source 104 through plasma generator 106, in which plasma generates activated ashing gas containing activated species. Ashing system 102 is further operable to flow activated ashing gas through inlet tube 116 into downstream ashing chamber 108. In accordance with the invention, ashing system 102 is operable to filter charged species out of activated ashing gas before it reaches ashing chamber 108. As a result, the ashing gas contains neutral activated species and substantially no charged species. Ashing system 102 is operable to heat (e.g., using a heater in substrate holder 112) a substrate 114 to a desired ashing temperature. During ashing in accordance with the invention, activated species react with organic material on substrate 114. Ashing system 102 is operable to control and vary the flow rate of ashing gas through plasma generator 106 into ashing chamber 108. Exhaust gas exits ashing chamber 108 through exhaust channel 118. Numerous designs of suitable ashing systems are known in the art. Exemplary suitable ashing systems include a model GAMMA® Express and the model G400™ ashing systems, both commercially available from Novellus Systems, Inc., San Jose, Calif. Some embodiments in accordance with the invention are described herein with reference to ashing system 102 depicted in FIG. 1. It is understood, however, that methods in accordance with the invention are adaptable to ashing systems different from ashing system 102 without departing from the scope of the invention. For example, ashing chamber 108 in ashing system 102 is located distinctly downstream and separate from plasma generator 106. In some suitable ashing systems, however, a plasma generator operable to generate activated ashing gas in accordance with the invention is located spatially closer to an ashing chamber.

Embodiments in accordance with the invention are particularly useful for removing organic photoresist having a carbonized (carbon-rich) crust from a substrate. As explained above, a carbonized crust typically arises as a result of an ion implantation process. Stripping of photoresist from a substrate after an ion implantation process is often referred to as high dose implant strip (HDIS) or high energy implant strip (HEIS). As described briefly above, in some embodiments, minimizing total ashing time of organic material in accordance with the invention is assisted by considering a so-called crossover temperature of the type of organic material in a particular ashing system under particular ashing operating conditions. The crossover temperature in a particular ashing system of organic material is also useful to explain the chemical and physical phenomena involved in embodiments in accordance with the invention.

The term "organic material" is used broadly in this specification to refer to material that is substantially organic. For example, commercially available photoresists commonly are blends of polymeric and other organic and inorganic materials.

FIG. 2 contains a process flow sheet of a generalized, representative method 200 in accordance with the invention for determining a crossover temperature of a particular type of organic material in an ashing system. An exemplary type of organic material is one of many types of photoresist commonly used in integrated circuit fabrication.

Step 205 includes heating a test sample of a type of organic material on substrate 114 at a test temperature in an ashing chamber 108. Generally, step 205 includes heating a test sample at a test temperature in a range from room temperature up to 400° C. In some applications, the upper end of that temperature range is higher. In applications involving photoresist used in integrated circuit fabrication, however, the maximum allowable or desirable process temperature is generally well below 400° C.; for example, in a range of about from 250° C. to 350° C. In applications involving photoresist, the crossover temperature is typically in a range of about from 180° C. to 250° C.

Step 210 includes flowing ashing gas to a plasma generator; for example, flowing ashing gas from gas source 104 to remote plasma generator 106 at a test flow rate. Ashing gas in photoresist stripping applications is typically oxygen-rich, that is, a substantial portion of the ashing gas flowing to the plasma generator is oxygen gas, $O_2$. In an exemplary six-station ashing system processing six 300 mm wafers, a representative stream of ashing gas from one or more gas sources includes from 400 standard cubic centimeters per minute (sccm) to 1000 sccm nitrogen, $N_2$, and 5 standard liters per minute (slm) to 15 slm $O_2$ gas at each of five ashing stations. In the exemplary ashing system, a plasma generator generates plasma using power at each of five ashing stations in a range of about from 2.0 to 6.5 kilowatts (kW) at a frequency of 13.56 Megahertz (MHz). In step 215, plasma in the plasma generator excites the ashing gas to generate activated ashing gas. Excited oxygen species in the plasma generator typically include non-charged oxygen free radicals and charged oxygen ions. Step 220 comprises flowing activated ashing gas containing activated species from plasma generator 106 to ashing chamber 108 at the test flow rate. In a downstream ashing system, charged ions are filtered out of the process gas stream. As a result, step 220 comprises flowing non-charged, neutral free radicals, such as free oxygen radicals. As is well known to one of ordinary skill in the art, in some downstream ashing applications, ashing gas includes reactive gases in addition to oxygen, such as $H_2$ gas and fluorine-containing compounds. Step 225 includes ashing the test sample of organic material in ashing chamber 108 at the test temperature and at the test flow rate to ash at least a portion of the test sample using the activated ashing species. A representative pressure in the ashing chamber is 1.5 Torr. Step 230 includes measuring the ashing time used to ash the portion of test sample in step 225. It is understood that in some embodiments, a uniform ashing time is used to ash a plurality of test samples and the step of measuring the ashing time consists essentially of knowing the ashing time used. Step 235 comprises measuring the amount of the portion ashed in step 225. Various techniques are available for measuring the amount of material ashed. In some embodiments, the amount is measured by measuring the difference in height of the top surface of a layer of organic material between the layer before ashing and after ashing. Step 240 includes calculating a measured ashing rate corresponding to the test temperature and the test flow rate based on the ashing time used to ash the portion of the test sample in step 225. Step 245 includes repeating steps 205 through 240 using one or more test samples of said type of organic material at a plurality of different combinations of test temperatures in a test temperature range and test flow rates in a test flow rate range to calculate a plurality of measured ashing rates.

Step 250 includes determining a crossover temperature of the type of organic material in the ashing system by comparing the measured ashing rates, wherein the crossover temperature is characterized in that below the crossover temperature, a decrease in test flow rate results in an increase of measured ashing rate, and above the crossover temperature, an increase in test flow rate within the test flow rate range results in an increase of measured ashing rate. The exact sequence of performing and repeating steps 235 and 240 is, of course, not critical. For example, in some embodiments, steps 205 through 230 are repeated for a plurality of test temperatures and test flow rates, and thereafter steps 235 and 240 are repeated for each combination of test temperature and test flow rate.

Example 1

The crossover temperature of a photoresist was determined in accordance with the invention in each of two ashing systems. Ashing in accordance with the invention was performed on series of test samples of SPR 3012 positive photoresist, commercially available from Rohm and Haas Electronic Materials LLC. The photoresist test samples consisted essentially of a layer of photoresist having a thickness of approximately 2.3 micrometers ($\mu m$) located on 300 mm semiconductor wafers. The test samples were ashed in a model GAMMA® ashing apparatus available from Novellus Systems, Inc. One set of test samples, designated below as "Std" (standard), was ashed using a model GAMMA® Express (Std) RF source. A second set of test samples, designated below as "HT", was ashed using a model GAMMA® HT RF source.

After temperature stabilization, ashing of each test sample was performed at only one ashing station. Ashing was performed at 1.5 Torr pressure using 5 kW power at 13.56 MHz. Ashing of each test sample was performed during an ashing time in a range of about from nine seconds (at high temperatures, e.g., 280° C.) to 30-60 seconds (at low temperatures, e.g., 140° C.). Ashing of each test sample was performed using a combination of a test temperature and a test flow rate. Test temperatures were selected from 140, 160, 180, 200, 220, 240, 260 and 280° C. Test flow rates were selected from 8.6, 10, 12, and 15 slm $O_2$. All test gas flow streams also included 400 sccm $N_2$ gas.

Figure 3:
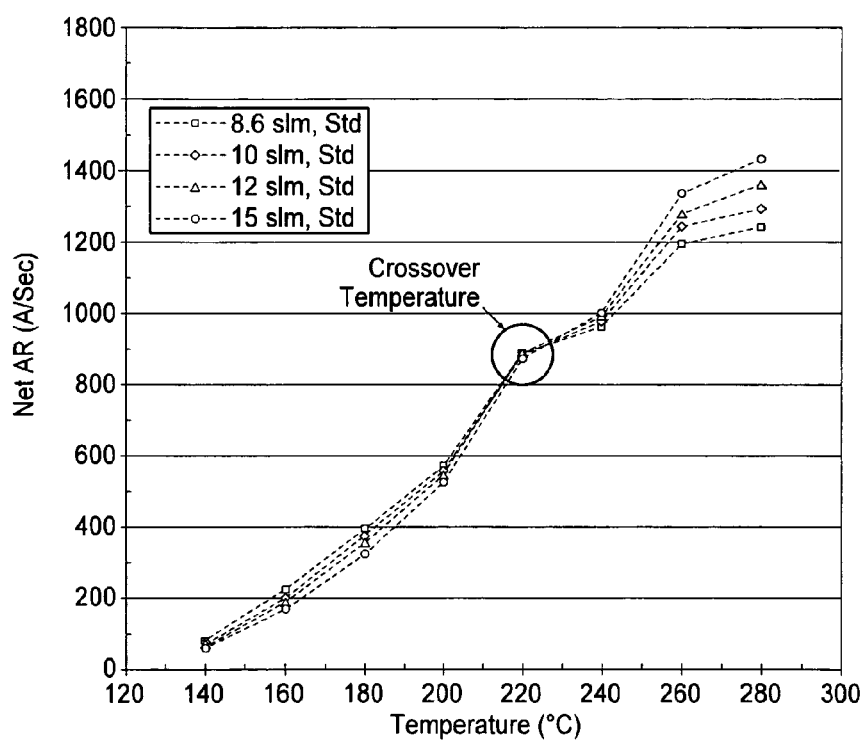
FIG. 3 contains a graph in which net ashing rate (AR) in units of Ångstrom (Å) units per second (Å/sec) at constant ashing-gas test flow rate and constant ashing temperature is plotted as a function of ashing temperature to determine the crossover temperature.
Figure 4:
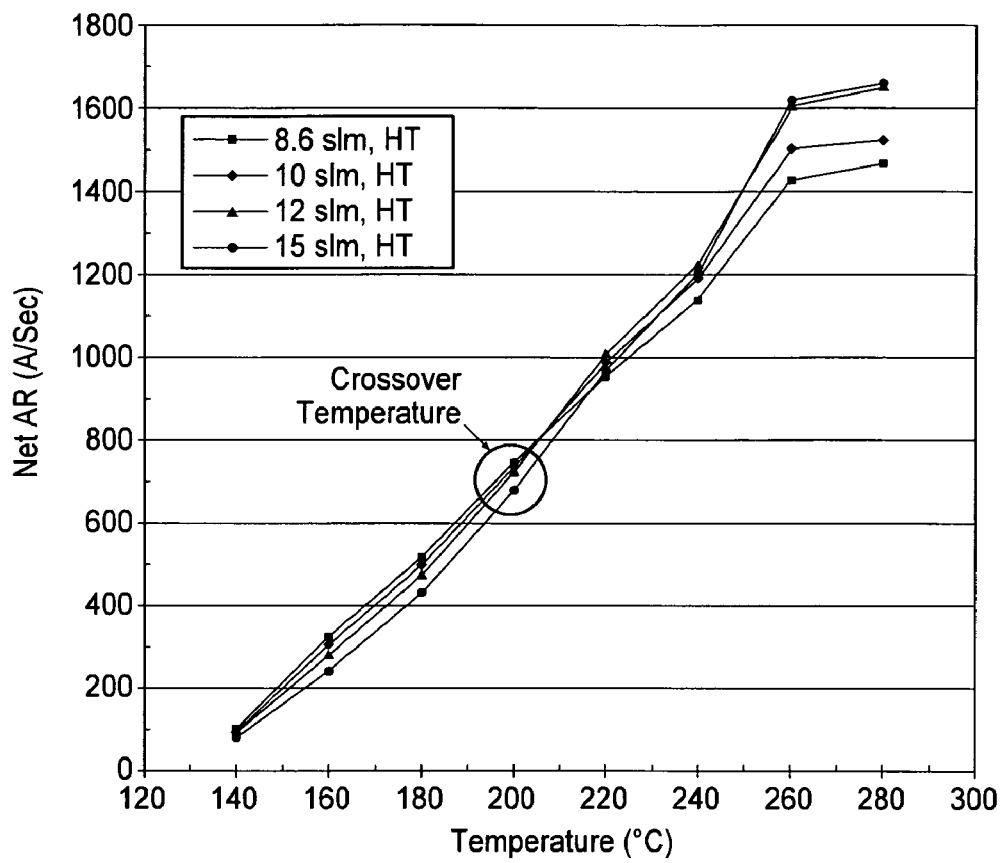
FIG. 4 contains a graph in which net ashing rate (AR) in units of Ångstrom (Å) units per second (Å/sec) at constant ashing-gas test flow rate and constant ashing temperature is plotted as a function of ashing temperature to determine the crossover temperature.

FIG. 3 contains a graph in which net ashing rate (AR) in units of Ångstrom (Å) units per second (Å/sec) at constant ashing-gas test flow rate and constant ashing temperature is plotted as a function of ashing temperature for test samples processed using the GAMMA® Express (Std) RF source. The dashed lines connecting the data points in the graph of FIG. 3 indicate a crossover temperature at about 220° C. The data show that at a temperature below the crossover temperature, the measured ashing rate was higher when the ashing gas test flow rate was 8.6 slm than when the test flow rate was higher within the test flow rate range. The data also show that at a temperature greater than the crossover temperature, the measured ashing rate was higher when the ashing gas test flow rate was 15 slm than when the test flow rate was lower. As expected, the net ashing rate generally always increased with increasing temperature. The effect of ashing gas flow rate on net ashing rate depended, however, on the ashing test temperature. FIG. 4 contains a graph in which net ashing rate (AR) in units of Ångstrom (Å) units per second (Å/sec) at constant ashing-gas test flow rate and constant ashing temperature is plotted as a function of ashing temperature for test samples processed using the GAMMA® HT RF source. The solid lines connecting the data points in the graph of FIG. 4 indicate a crossover temperature at about 200° C. The data show that at a temperature below the crossover temperature, the measured ashing rate was higher when the ashing gas test flow rate was 8.6 slm than when the test flow rate was higher. The data also show that at a temperature greater than the crossover temperature, the measured action rate was higher when the ashing gas test flow rate was 15 slm than when the test flow rate was lower. As expected, the net ashing rate generally always increased with increasing temperature. The effect of ashing gas flow rate on net ashing rate depended, however, on the ashing test temperature.

Without being bound to any particular theory, it is believed that above the crossover temperature of a given organic material in a given ashing system, the thermochemical reaction rate of activated species, such as activated oxygen, with the material being ashed generally increases with increased ashing gas flow rate because more activated species is available for reaction. Below the crossover temperature, however, the reaction rate of activated species with organic material is generally slower because of the lower temperature. Without being bound to any particular theory, it is believed that the slower reaction rate causes activated species to accumulate at the surface because they are not reacting as fast as at higher temperature. It is believed that the accumulated activated species block mass transport of volatilized solvent and reaction products away from the reaction surface, resulting in reduced mass transfer of un-reacted activated species to the organic material. It is also believed that the accumulation of activated species in some instances results in recombination of the activated species to a non-activated form; for example, recombination of two oxygen free radicals to form relatively non-reactive molecular oxygen, $O_2$. One of ordinary skill in the art will recognize the natural physical and chemical limits to the phenomena described herein. For example, for a given reaction temperature above the crossover temperature, for example, 280° C. in the graph of FIG. 4, an increase in ashing gas flow rate above some saturation flowrate does not result in increased ashing rate. Similarly, one of ordinary skill in the art will recognize that at a given temperature below the crossover temperature, lowering the ashing gas flow rate below some minimum flow rate does not increase the net ashing rate. For example, lowering the ashing gas flow rate to zero obviously decreases the ashing rate. Thus, in step 245 of method 200, one of ordinary skill in the art will recognize or easily determine a suitable test temperature range and a suitable test flow rate range from which different test temperatures and different test flow rates are selected.

Figure 5:
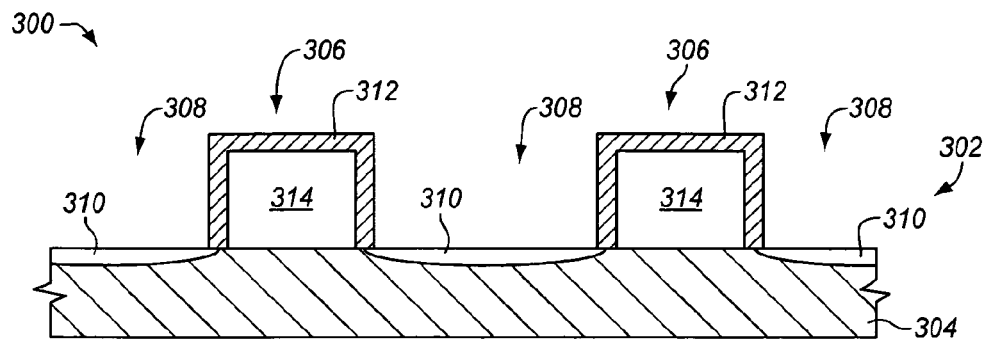
FIG. 5 depicts schematically a cross-sectional view of an integrated circuit substrate in an intermediate phase of fabrication after a high-dose implantation process.

FIG. 5 depicts schematically a cross-sectional view 300 of an integrated circuit substrate 302 in an intermediate phase of fabrication after a high-dose implantation process. Substrate 302 includes underlying semiconductor layer 304 and patterned photoresist layer 306. Patterned photoresist layer 306 defines exposed areas 308. High-dose implantation of substrate 302 has resulted in implanted (or doped) regions 310 in semiconductor layer 304 corresponding to exposed areas 308. High-dose implantation has also caused carbonization of the exposed surfaces of photoresist 306, resulting in carbonized (carbon-rich) crust 312 covering un-carbonized bulk photoresist 314.

An ashing method in accordance with the invention is particularly useful for removing from a substrate an organic photoresist having a carbonized crust as depicted in FIG. 5. In accordance with the invention, in the first low-temperature phase, ashing is performed at a first temperature below the crossover temperature to avoid the undesired popping phenomenon until the carbonized crust is substantially removed. During the low-temperature phase, ashing is performed using a relatively low flow rate of ashing gas to maximize ashing rate. FIG. 6 depicts cross-sectional view 320 of substrate 302 after substantial removal of carbonized crust 312 by ashing at low temperature in accordance with the invention. A substantial portion of bulk (substantially un-carbonized) photoresist 314 remains on substrate 302. Since substantially no carbonized crust covers bulk photoresist 314, the risk of popping has been substantially eliminated, and ashing may be performed in a high-temperature phase at a higher temperature above the crossover temperature to increase the ashing rate of the organic photoresist. In accordance with the invention, in the high-temperature phase, ashing is performed using a higher flow rate of ashing gas to maximize ashing rate. One of ordinary skill in the art understands that the maximum allowable ashing temperature in the high-temperature phase is usually determined by thermal budget constraints and maximum temperature constraints common in electronic device fabrication to avoid heat damage. FIG. 7 depicts cross-sectional view 330 of substrate 302 after removal of bulk photoresist in accordance with the invention.

FIG. 8 contains a process flow sheet of a generalized method 400 in accordance with the invention for minimizing total ashing time of organic material in an ashing system. Method 400 is described herein with reference to FIGS. 5-7. It is understood, however, that a generalized method 400 is useful for minimizing total ashing time of organic material different from that depicted in and described with reference to FIGS. 5-7. Step 405 comprises heating in a low-temperature ashing chamber a substrate 302 containing an initial layer 306 of organic material at a low temperature below a crossover temperature of said organic material in an ashing system. Step 410 includes flowing ashing gas to a remote plasma generator. Typically, the ashing gas going to the plasma generator comprises an oxygen-containing species, such as molecular oxygen, $O_2$. In some embodiments, the ashing gas includes a halogen-containing compound or other compound in addition to (or instead of) the oxygen-containing species. Step 415 includes generating activated ashing species in the ashing gas using the remote plasma generator. Step 420 comprises flowing activated ashing gas containing activated ashing species into the low-temperature ashing chamber at a low flow rate. Typically, the activated ashing species flowing into the ashing chamber comprises neutral (uncharged) oxygen free radicals. In some embodiments in which the ashing gas going to the plasma generator includes one or more other excitable reactant gases, such as a halogen-containing compound, the activated ashing species comprise corresponding uncharged activated species. Step 425 comprises performing ashing of the layer of organic material at the low temperature and at the low flow rate to ash an initial portion of the layer of organic material using the activated ashing species in the low-temperature ashing chamber. For example, in some embodiments, step 425 comprises ashing carbonized crust 312 (FIG. 5) of photoresist layer 306. Thereafter, step 430 comprises heating the substrate in a high-temperature ashing chamber at a high temperature above the crossover temperature of the organic material in the ashing system. Step 435 comprises flowing an ashing gas to a remote plasma generator. In some embodiments, the ashing gas flowing into the plasma generator in step 435 is substantially identical to the ashing gas flowing to the plasma generator in step 410. In some embodiments, however, the ashing gas flowing into the plasma generator in step 435 has a chemical composition that is different from the ashing gas used in step 410. For example, in some embodiments, the reactant ashing gas of step 410 is molecular oxygen and the corresponding activated ashing species in step 420 is neutral oxygen radicals, while the ashing gas in step 435 includes both molecular oxygen and a halogen-containing compound. Step 440 includes generating activated ashing species in the ashing gas using the remote plasma generator. In some embodiments, the remote plasma generator used in step 440 is the same generator used in step 415. In some embodiments, the remote plasma generator used in step 440 is different from the generator used in step 415. Step 445 includes flowing activated ashing gas containing activated ashing species into the high-temperature ashing chamber at a high flow rate. As in step 420, the activated ashing species flowing into the ashing chamber substantially comprise neutral (uncharged) free radical species. Step 450 comprises performing ashing of the organic material using the activated ashing species in the high-temperature ashing chamber at the high temperature and at the high ashing gas flow rate to ash an additional portion of the layer of organic material, for example, the entire remaining portion of the organic material. For example, in some embodiments, step 450 comprises ashing bulk photoresist 314 (FIG. 6) to remove bulk photoresist 314 completely from substrate 302 (FIG. 7).

In embodiments in accordance with the invention used in a HDIS process, a preferred low temperature is the maximum temperature that avoids undesired popping of a carbonized crust of a photoresist. In some embodiments in accordance with the invention, a preferred high temperature is the maximum temperature allowed by thermal budget constraints of the fabrication process or the maximum processing temperature allowed for one or more materials located on the workpiece substrate. In some embodiments, a range of low flow rates is defined at the lower end of the range by a minimum flow rate that maximizes ashing rate at a given low temperature, and an ashing gas flow rate above this maximizing flowrate causes a decrease in ashing rate. In some embodiments, a range of high flow rates is defined at the higher end of the range by a flow rate that maximizes ashing rate at a given high temperature, and an ashing gas flow rate above this maximizing flow rate does not increase ashing rate.

In some embodiments in accordance with the invention, activated ashing gas also includes non-charged, free radicals, such as fluorine radicals, in addition to oxygen free radicals. In some embodiments, the additional free radicals are useful, for example, for removing residues completely from a substrate and for lowering the activation energy of the thermo-chemical ashing reaction. In such embodiments, however, the dominant ashing reaction for removing both a carbonized crust and the bulk photoresist is the reaction of oxygen radicals with the material being removed. Also, it has been observed that the presence of activated species in addition to oxygen radicals does not substantially affect the value of the crossover temperature measured using only oxygen (e.g., as in Example 1).

Thus, in some embodiments, the ashing gas used to determine the crossover temperature of an organic material in a particular ashing system has a composition substantially different from the ashing gases used in at least one of steps 410-425 and/or steps 435-450. Commonly, the ashing gas used to determine the crossover temperature of an organic material in a particular ashing system has a composition substantially similar to the ashing gases used in at least one of steps 410-425 and/or steps 435-450.

Ashing in accordance with the invention was described with reference to removal of organic photoresist having a carbonized crust, as depicted in FIG. 5. One of ordinary skill in the art understands, however, that ashing in accordance with the invention is useful for minimizing the total ashing time in any application in which processing constraints, such as thermal budget or maximum temperature constraints, limit the maximum processing temperature during a portion or all of an ashing process.

Example 2

An ashing method in accordance with the invention was used to perform a high dose implant strip (HDIS) of a photoresist layer having a carbonized crust. For comparison, a best-known method (BKM) of the prior art was used to remove a similar photoresist layer having a carbonized crust.

A 300 mm semiconductor wafer contained a layer of SPR 3012 positive photoresist. Using techniques well known in the art, a high dose implantation of arsenic was conducted, resulting in a doped layer having a concentration of approximately $4 \times 10^{15}$ atoms per cubic centimeter and a thickness in a range of about from 800 Å to 1500 Å. The resulting carbonized crust had a thickness in a range of about from 500 Å to 1000 Å, and the underlying bulk layer of photoresist had a thickness of approximately 1.2 μm. Ashing of the photoresist was performed in a six-station model GAMMA® ashing system using a model GAMMA® HT RF source.

The processing time at each of six stations was four seconds. At the first station, the wafer was preheated to about 100° C., but no ashing with activated ashing species was performed. At stations 2 and 3, the wafer substrate was heated at about 140° C. to avoid the popping phenomenon described above that typically occurs at higher temperatures when volatile solvent evolves faster than it can escape through a carbonized crust. At each of stations 2 and 3, the ashing gas stream flowing to the plasma generator consisted essentially of 400 sccm $N_2$ and 7 slm $O_2$. At stations 4, 5 and 6, the wafer substrate was heated at a typical bulk removal temperature of 285° C. At each of stations 4, 5 and 6, the ashing gas stream flowing to the plasma generator consisted essentially of 400 sccm $N_2$ and 12 slm $O_2$. Ashing was performed at 1.5 Torr pressure using 5 kW power at 13.56 MHz at each station. Using techniques well known in the art, a photodiode detector was used to monitor the evolution of $CO_2$, a characteristic product of the thermochemical ashing reaction, and thereby monitor the course of the stripping (ashing) process. The measurements were expressed as "EOP Signal" (end-of-process signal) and represent the relative rate of reaction at any given time of measurement.

For comparison, a substantially identical layer of photoresist with carbonized crust was processed in the same ashing system under the same operating conditions except using ashing gas flow rates in accordance with the BKM HDIS method of the prior art. Instead of varying the ashing gas flow rate between groups of stations, ashing gas at a flow rate of 8.6 slm flowed to each of stations 2-6. Substrate heating at each of the stations was controlled as above; that is, 140° C. at stations 2 and 3, and 285° C. at stations 4-6. The course of the ashing process was monitored as described above.

FIG. 9 contains a graph in which EOP Signal is plotted as a function of time. The graph contains data points for ashing performed in accordance with the invention, designated "Smart O2", and data points for ashing performed using the best-known method of the prior art, which data points are designated "BKM O2". The data plotted in the graph of FIG. 9 show that the Smart ashing rate (in accordance with the invention) is higher than the BKM ashing rate during the first eight seconds, corresponding to the ashing being performed at stations 2 and 3. Also, the Smart ashing rate increased quickly at about seven seconds time, while the BKM ashing rate increased quickly after eight seconds of ashing. It is believed that the relatively fast increase in ashing rate of both sets of data occurred at the point in time when the carbonized crust covering the bulk photoresist had been substantially completely removed. The data indicate that this occurred one second earlier using a Smart method in accordance with the invention than when using the BKM method. Applying the results of Example 2 to operations of a typical integrated circuit fabrication tool suggests that a method in accordance with the invention could improve wafer throughput by about 10 to 20 wafers (or more) per hour.

Example 3

Ashing of bulk photoresist was performed on a series of wafers using the Smart method (in accordance with the invention) and the BKM of the prior art under conditions similar to those described in Example 2 except that the ashing time was varied between wafers and the initial photoresist did not have a carbonized crust. Then, the cumulative amount of photoresist removed from each wafer was measured.

Each of the semiconductor wafers was prepared to have a bulk layer of SPR 3012 positive photoresist with a thickness of approximately 2.3 μm and no carbonized crust. Ashing of the bulk photoresist was performed in a six-station model GAMMA® ashing system using a model GAMMA® HT RF source. After pre-heating at 100° C. without ashing at the first station, ashing was performed at 1.5 Torr pressure using 5 kW power at 13.56 MHz at each of the five remaining stations. At each of stations 2 and 3, the ashing gas stream flowing to the plasma generator consisted essentially of 400 sccm $N_2$ and 7 slm $O_2$. At stations 4, 5 and 6, the wafer substrate was heated at a typical bulk removal temperature of 285° C. At each of stations 4, 5 and 6, the ashing gas stream flowing to the plasma generator consisted essentially of 400 sccm $N_2$ and 12 slm $O_2$.

Because the thickness of initial photoresist layers was only 2.3 μm and the expected cumulative amount of photoresist removal during 15-20 seconds of ashing was greater than 2.3 μm, a set of five identical semiconductor wafers was processed by ashing each wafer at only one of the five stations. Thereafter, the amount of photoresist removal from each of the five wafers was measured and added together to calculate the cumulative total of photoresist removed at all five stations.

The process time at each station was different between sets of wafers; that is, the process time at each station for a particular set of five wafers was 3.0, 3.5, 3.8 or 4.0 seconds, respectively. For example, when the ashing time at each station was 3.0 seconds, the total ashing time for the set of five wafers was 15 seconds. When the ashing time at each station was 4.0 seconds, the total ashing time for the set of five wafers was 20 seconds.

For comparison, a second group of sets of five semiconductor wafers having a similar layer of bulk photoresist was processed in the same ashing system under similar operating conditions except using ashing gas flow rates in accordance with the BKM HDIS method of the prior art. Instead of varying the ashing gas flow rate between groups of stations, ashing gas at a flow rate of 8.6 slm flowed to each of stations 2-6. Substrate heating at each of the stations was controlled as above; that is, 140° C. at stations 2 and 3, and 285° C. at stations 4-6. The process time at each station was different between sets of five wafers; that is, the process time at each station for a particular set of wafers was 3.0, 3.5, or 4.0 seconds, respectively. The cumulative amount of photoresist removed from each set of five wafers was measured after ashing was completed.

FIG. 10 contains a graph in which cumulative photoresist removal in units of μm is plotted as a function of process time at each station. Data points corresponding to ashing in accordance with the invention, designated "Smart O2" and data points corresponding to ashing using BKM flow rate, designated "BKM O2" are plotted in the graph of FIG. 10. The data indicate an improvement of about 15% in cumulative bulk photoresist removal achieved by ashing in accordance with the invention (for station process times of 4.0 seconds). This percentage improvement corresponds to a representative throughput improvement of up to about 5 to 10 wafers (or more) per hour.

Some embodiments in accordance with the invention do not include explicit use of a crossover temperature or actual determination of the crossover temperature of an organic material in a given ashing system. Therefore, some embodiments of a method in accordance with the invention do not necessarily include knowledge of the actual, specific value of the crossover temperature of an organic material in a given ashing system. Based on the disclosure of this specification, however, one skilled in the art will now understand that for practically any organic material used in the manufacture of electronic devices, particularly photoresist materials used in the manufacture of electronic devices, there exists a crossover temperature characterized in that below the crossover temperature, a decrease in ashing gas flow rate results in an increase of ashing rate, and above the crossover temperature, an increase in ashing gas flow rate results in an increase of ashing rate. With this knowledge, one of ordinary skill in the art is able to design an improved ashing method in accordance with the invention to decrease or to minimize the total ashing time of organic material in ashing system.

For example, in a case of removing photoresist having a carbonized crust from a substrate, one skilled in the art commonly knows a maximum temperature at which ashing is performed to avoid the risk of undesired popping of volatilized solvent through the carbonized crust. This maximum temperature for crust removal serves as a low temperature in a method in accordance with the invention. Based on knowledge and techniques known to one of ordinary skill in the art, a low flow rate in accordance with the invention is selected to maximize ashing rate at the low temperature. One of ordinary skill in the art understands, of course, that one does not maximize the ashing rate at a low temperature by lowering the ashing gas flow rate to zero flow rate. Rather, one of ordinary skill in the art understands that some minimum ashing gas flow rate is necessary to provide sufficient activated ashing species to the substrate to maximize the ashing rate, but that an ashing gas flow rate substantially greater than this minimum ashing gas flow rate actually reduces the ashing rate at the low temperature. There is, therefore, a range of ashing gas flow rates of a particular ashing gas at a given low-temperature in a given ashing gas system in which a lower ashing gas flow rate causes a higher ashing rate. Similarly, a maximum high temperature exists in a given fabrication process, typically determined by thermal budget constraints or by a maximum processing temperature of one or more materials located on the substrate at the time of ashing. Generally, in accordance with the invention, ashing rate at high temperature is maximized by increasing ashing gas flow rate until some upper limit is reached at which ashing rate levels off, that is, an increase in ashing gas flow rate does not increase the ashing rate.

In contrast, best known methods of the prior art, without working knowledge of the existence of a crossover temperature for practically any organic material in an ashing system, typically selected a single ashing gas flow rate that was used at all ashing temperatures. It was generally believed that within the usual ranges of ashing gas flow rates, an increase in ashing gas flow rate up to some maximum flow rate resulted in an increased ashing rate of organic material. Using common trial and error methods or even using systematic experimental studies, a single ashing gas flow rate was selected and used at all temperatures during HDIS to achieve a maximum net ashing rate (i.e., to minimize total ashing time). The BKM flow rate of 8.6 slm in Example 3 is an example of an ashing gas flow rate of the prior art selected for use at all temperatures.

FIG. 11 contains a process flow sheet of a generalized method 500 in accordance with the invention for minimizing total ashing time of organic material in an ashing system without explicit reference to a crossover temperature. Method 500 is described herein with reference to FIGS. 5-7. It is understood, however, that a generalized method 500 is useful for minimizing total ashing time of organic material different from that depicted in and described with reference to FIGS. 5-7. Step 505 comprises heating in a low-temperature ashing chamber a substrate 302 containing an initial layer 306 of organic material at a low temperature. An example of a suitable low-temperature is the maximum allowable ashing temperature in an HDIS process that avoids the risk of popping of a carbonized crust. Step 510 includes flowing ashing gas to a remote plasma generator. Typically, the ashing gas going to the plasma generator comprises an oxygen-containing species, such as molecular oxygen, $O_2$. In some embodiments, the ashing gas includes a halogen-containing compound or other compound in addition to (or instead of) the oxygen-containing species. Step 515 includes generating activated ashing species in the ashing gas using the remote plasma generator. Step 520 comprises flowing activated ashing gas containing activated ashing species into the low-temperature ashing chamber at a low flow rate. In some embodiments, a low ashing gas flow rate is selected to maximize ashing rate at a given low-temperature. Typically, the activated ashing species flowing into the ashing chamber comprises neutral (uncharged) oxygen free radicals. In some embodiments in which the ashing gas going to the plasma generator includes one or more other excitable reactant gases, such as a halogen-containing compound, the activated ashing species comprises corresponding uncharged activated species. Step 525 comprises performing ashing of the layer of organic material at the low temperature and at the low flow rate to ash an initial portion of the layer of organic material using the activated ashing species in the low-temperature ashing chamber. For example, in an HDIS process, step 525 comprises ashing carbonized crust 312 (FIG. 5) of photoresist layer 306. Thereafter, step 530 comprises heating the substrate in a high-temperature ashing chamber at a high temperature. An example of the high temperature in an HDIS process is the maximum allowable temperature that satisfies thermal budget constraints of fabrication or maximum temperature limits of a particular material of construction. Step 535 comprises flowing an ashing gas to a remote plasma generator. In some embodiments, the chemical composition of ashing gas flowing into the plasma generator in step 535 is substantially identical to the ashing gas flowing to the plasma generator in step 510. In some embodiments, however, the ashing gas flowing into the plasma generator in step 535 has a chemical composition that is different from the ashing gas used in step 510. For example, in some embodiments, the reactant ashing gas of step 510 is molecular oxygen and the corresponding activated ashing species in step 520 is neutral oxygen radicals, while the ashing gas in step 535 includes both molecular oxygen and a halogen-containing compound. In some embodiments in accordance with the invention, therefore, activated ashing gas also includes non-charged, free radicals, such as fluorine radicals, in addition to oxygen free radicals. In some embodiments, the additional free radicals are useful, for example, for removing residues completely from a substrate and for lowering the activation energy of the thermochemical ashing reaction. In such embodiments, however, the dominant ashing reaction for removing both a carbonized crust and the bulk photoresist is typically the reaction of oxygen radicals with the material being removed. Step 540 includes generating activated ashing species in the ashing gas using the remote plasma generator. In some embodiments, the remote plasma generator used in step 540 is the same generator used in step 515. In some embodiments, the remote plasma generator used in step 540 is different from the generator used in step 515. Step 545 includes flowing activated ashing gas containing activated ashing species into the high-temperature ashing chamber at a high flow rate. In some embodiments, a high ashing gas flow rate is selected to maximize ashing rate at a given high-temperature. As in step 520, the activated ashing species flowing into the ashing chamber substantially comprise neutral (uncharged) free radical species. Step 550 comprises performing ashing of the organic material using the activated ashing species in the high-temperature ashing chamber at the high temperature and at the high ashing gas flow rate to ash an additional portion of the layer of organic material; for example, the entire remaining portion of the organic material. For example, in some embodiments, step 550 comprises ashing bulk photoresist 314 (FIG. 6) to remove bulk photoresist 314 completely from substrate 302 (FIG. 7).

Methods and systems in accordance with the invention are useful in a wide variety of circumstances and applications. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. For example, in applications in which a first ashing temperature is high and the second ashing temperature is low, the sequence of steps in methods described above may be switched without departing from the scope of the invention. Since certain changes may be made in the above systems and methods without departing from the scope of the invention, it is intended that all subject matter contained in the above description or shown in the accompanying drawings be interpreted as illustrative and not in a limiting sense. Consequently, the invention is to be construed as embracing each and every novel feature and novel combination of features present in or inherently possessed by the methods and structures described in the claims below and by their equivalents.

The invention claimed is:

1. A method of determining a crossover temperature of a type of organic material in an ashing system, comprising:
   (a) heating a test sample of a type of organic material at a test temperature in an ashing chamber;
   (b) flowing ashing gas to a remote plasma generator;
   (c) generating activated ashing species in said ashing gas using said remote plasma generator;
   (d) flowing activated ashing gas containing said activated ashing species into said ashing chamber at a test flow rate;
   (e) ashing a portion of said test sample in said ashing chamber at said test temperature and at said test flow rate using said activated ashing species;
   (f) measuring an ashing time used to ash said portion of said test sample;
   (g) measuring an amount of said portion of said test sample that was ashed; and
   (h) calculating a measured ashing rate corresponding to said test temperature and said test flow rate based on said ashing time used to ash said amount of said portion of said test sample that was ashed;
   (i) repeating (a) through (h) using at least one test sample of said type of organic material at a plurality of different combinations of test temperatures and test flow rates to calculate a plurality of measured ashing rates; and
   (j) determining a crossover temperature of said type of organic material in said ashing system by comparing said measured ashing rates, wherein said crossover temperature is characterized in that below said crossover temperature, a decrease in test flow rate results in an increase of measured ashing rate, and above said crossover temperature, an increase in test flow rate results in an increase of measured ashing rate.

2. The method of claim 1 wherein:
said type of organic material comprises photoresist.

3. The method of claim 1, further comprising:
   (k) determining a preferred low flow rate of said ashing gas corresponding to a preferred low-temperature ashing rate below said crossover temperature.

4. The method of claim 1, further comprising:
   (l) determining a preferred high flow rate of said ashing gas corresponding to a preferred high-temperature ashing rate above said crossover temperature.

5. A method of minimizing total ashing time of organic material in an ashing system, comprising:
   (a) heating in a low-temperature ashing chamber a substrate containing an initial layer of organic material at a low temperature below a crossover temperature of said organic material in an ashing system, wherein said crossover temperature is characterized in that below said crossover temperature, a decrease in test flow rate results in an increase of measured ashing rate, and above said crossover temperature, an increase in test flow rate results in an increase of measured ashing rate;
   (b) flowing a first ashing gas to a first remote plasma generator;
   (c) generating first activated ashing species in said first ashing gas using said first remote plasma generator;
   (d) flowing first activated ashing gas containing said first activated ashing species into said low-temperature ashing chamber at a low flow rate;
   (e) ashing an initial portion of said layer of organic material at said low temperature and at said low flow rate using said first activated ashing species in said low-temperature ashing chamber;
   (f) heating said substrate in a high-temperature ashing chamber at a high temperature above said crossover temperature of said organic material in said ashing system;
   (g) flowing a second ashing gas to one of said first remote plasma generator and a second remote plasma generator;
   (h) generating a second activated ashing species in said second ashing gas using said one of said first remote plasma generator and said second remote plasma generator;
   (i) flowing said second activated ashing gas containing said second activated ashing species into said high-temperature ashing chamber at a high flow rate; and
   (j) ashing an additional portion of said organic material at said high temperature and at said high flow rate using said second activated ashing species in said high-temperature ashing chamber.

6. The method of claim 5 wherein:
said low flow rate of said first ashing gas corresponds to a preferred low-temperature ashing rate below said crossover temperature.

7. The method of claim 5 wherein:
said high flow rate of said second ashing gas corresponds to a preferred high-temperature ashing rate above said crossover temperature.

8. The method of claim 5 wherein:
said activated ashing species in (e) and (j) comprise oxygen free radicals, O.

9. The method of claim 5, wherein the first ashing gas and the second ashing gas have the same chemical composition.

10. The method of claim 5, wherein the first ashing gas and the second ashing gas have different chemical composition.

11. The method of claim 5, further comprising determining said crossover temperature of said organic material in said ashing system, wherein determining said crossover temperature comprises:
   (m) heating a test sample of said organic material at a test temperature in an ashing chamber;
   (n) flowing a third ashing gas to one of said first remote plasma generator, said second remote plasma generator and a third remote plasma generator;
   (o) generating a third activated ashing species in said ashing gas using said one of said first remote plasma generator, said second remote plasma generator and said third remote plasma generator;
   (p) flowing third activated ashing gas containing said third activated ashing species into said ashing chamber at a test flow rate;
   (q) ashing at least a portion of said test sample in said ashing chamber at said test temperature and at said test flow rate using said third activated ashing species;
   (r) measuring an ashing time used to ash said portion of said test sample that was ashed;
   (s) measuring an amount of said portion of said test sample that was ashed; and
   (t) calculating a measured ashing rate corresponding to said test temperature and said test flow rate based on said ashing time used to ash said portion of said test sample;
   (u) repeating said steps (m) through (t) using at least one test sample of said organic material at a plurality of different combinations of test temperatures and test flow rates to calculate a plurality of measured ashing rates; and
   (v) determining said crossover temperature of said organic material in said ashing system by comparing said measured ashing rates.

12. The method of claim 11 wherein:
said third ashing gas used in at least one of (n) and (o) is substantially similar to at least one of said first ashing gas used in at least one of (b)-(c) and said second ashing gas used in at least one of (g)-(h).

13. The method of claim 11 wherein:
said third ashing gas in used in at least one of (n) and (o) has a composition substantially different from at least one of said first ashing gas used in at least one of steps (b)-(c) and said second ashing gas used in at least one of (g)-(h).

14. The method of claim 5 wherein:
said layer of organic material comprises photoresist.

15. The method of claim 14 wherein:
said layer of organic material comprises a carbonized crust.

16. The method of claim 15 wherein:
(e) includes ashing at least a portion of said carbonized crust.

17. The method of claim 16 wherein:
said low flow rate of said first ashing gas corresponds to a preferred low-temperature ashing rate below said crossover temperature.

18. The method of claim 16 wherein:
said high flow rate of said second ashing gas corresponds to a preferred high-temperature ashing rate above said crossover temperature.

19. A method of minimizing total ashing time of organic material in an ashing system, comprising:
   (a) heating a substrate containing organic material at a low temperature in a low-temperature ashing chamber;
   (b) flowing a first ashing gas to a first remote plasma generator;
   (c) generating a first activated ashing species in said first ashing gas using said first remote plasma generator;
   (d) flowing a first activated ashing gas containing said first activated ashing species into said low-temperature ashing chamber at a low flow rate;
   (e) ashing an initial portion of said organic material at said low temperature and at said low flow rate using said first activated ashing species in said low-temperature ashing chamber;
   (f) heating said substrate at a high temperature in a high-temperature ashing chamber;
   (g) flowing a second ashing gas to one of said first remote plasma generator and a second remote plasma generator;
   (h) generating a second activated ashing species in said ashing gas using said one of said first remote plasma generator and said second remote plasma generator;
   (i) flowing a second activated ashing gas containing said second activated ashing species into said high-temperature ashing chamber at a high flow rate; and
   (j) ashing an additional portion of said organic material at said high temperature and at said high flow rate using said second activated ashing species in said high-temperature ashing chamber.

20. The method of claim 19 wherein:
said first ashing gas in (b) comprises a halogen gas; and
said first activated ashing species in (c) comprise halogen species.

21. The method of claim 19 wherein:
said first activated ashing species and said second activated ashing species in (e) and (j), respectively, comprise oxygen free radicals, O.

22. The method of claim 19, wherein the first ashing gas and the second ashing gas have the same chemical composition.

23. The method of claim 19, wherein the first ashing gas and the second ashing gas have different chemical composition.

24. The method of claim 19 wherein:
said low temperature is selected from a low-temperature range; and
said low flow rate is selected from a low flow-rate range, wherein a lower flow rate within said low flow-rate range results in a faster ashing rate of said organic material when ashing is performed within said low-temperature range.

25. The method of claim 24 wherein:
said low-temperature range does not exceed a crossover temperature of said organic material in said ashing system, wherein said crossover temperature is characterized in that below said crossover temperature, a decrease in test flow rate results in an increase of measured ashing rate, and above said crossover temperature, an increase in test flow rate results in an increase of measured ashing rate.

26. The method of claim 19 wherein:
said high temperature is selected from a high-temperature range; and
said high flow rate is selected from a high flow-rate range, wherein a higher flow rate within said high flow-rate range results in a faster ashing rate of said organic material when ashing is performed within said high-temperature range.

27. The method of claim 26 wherein:
said high-temperature range is not less than a crossover temperature of said organic material in said ashing system, wherein said crossover temperature is characterized in that below said crossover temperature, a decrease in test flow rate results in an increase of measured ashing rate, and above said crossover temperature, an increase in test flow rate results in an increase of measured ashing rate.

28. The method of claim 19 wherein:
flowing said first ashing gas in (b) comprises flowing substantially oxygen-containing gas; and
generating said first activated ashing species in (c) comprises generating substantially activated oxygen species.

29. The method of claim 28 wherein:
said oxygen-containing gas comprises substantially oxygen ($O_2$) gas.

30. The method of claim 28 wherein:
said first activated ashing species comprise substantially no halogen species.

31. The method of claim 19 wherein:
said organic material comprises photoresist.

32. The method of claim 31 wherein:
said layer of organic material comprises a carbonized crust.

33. The method of claim 32 wherein:
said (e) includes ashing at least a portion of said carbonized crust.

34. A method of minimizing total ashing time of organic material in an ashing system, comprising:
(a) heating a substrate containing organic material at a high temperature in a high-temperature ashing chamber;
(b) flowing a first ashing gas to a first remote plasma generator;
(c) generating a first activated ashing species in said first ashing gas using said first remote plasma generator;
(d) flowing a first activated ashing gas containing said first activated ashing species into said high-temperature ashing chamber at a high flow rate;
(e) ashing an initial portion of said organic material at said high temperature and at said high flow rate using said first activated ashing species in said high-temperature ashing chamber;
(f) heating said substrate at a low temperature in a low-temperature ashing chamber;
(g) flowing a second ashing gas to one of said first remote plasma generator and a second remote plasma generator;
(h) generating a second activated ashing species in said second ashing gas using said one of said first remote plasma generator and said second remote plasma generator;
(i) flowing said second activated ashing gas containing said second activated ashing species into said low-temperature ashing chamber at a low flow rate; and
(j) ashing an additional portion of said organic material at said low temperature and at said low flow rate using said second activated ashing species in said low-temperature ashing chamber.

35. The method of claim 34, wherein the first ashing gas and the second ashing gas have the same chemical composition.

36. The method of claim 34, wherein the first ashing gas and the second ashing gas have different chemical composition.

* * * * *